United States Patent
Martin et al.

(10) Patent No.: US 7,251,762 B2
(45) Date of Patent: Jul. 31, 2007

(54) ON-CHIP SAMPLING CIRCUIT AND METHOD

(75) Inventors: Chris Martin, Boise, ID (US); James Brian Johnson, Boise, ID (US); Troy Manning, Meridian, ID (US); Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 149 days.

(21) Appl. No.: 11/109,535

(22) Filed: Apr. 19, 2005

(65) Prior Publication Data

US 2006/0236170 A1 Oct. 19, 2006

(51) Int. Cl.
*G01R 31/28* (2006.01)

(52) U.S. Cl. .................. 714/724; 714/30; 714/734; 703/28; 324/754; 365/201

(58) Field of Classification Search ............ None
See application file for complete search history.

(56) References Cited

U.S. PATENT DOCUMENTS

| | | | |
|---|---|---|---|
| 4,779,088 A | 10/1988 | Restrepo | |
| 5,317,711 A * | 5/1994 | Bourekas et al. ............. | 714/47 |
| 5,414,708 A | 5/1995 | Webber et al. | |
| 5,530,706 A * | 6/1996 | Josephson et al. .......... | 714/727 |
| 5,651,129 A | 7/1997 | Yokote et al. | |
| 5,771,240 A * | 6/1998 | Tobin et al. ................. | 714/724 |
| 5,838,692 A * | 11/1998 | Tobin ......................... | 714/724 |
| 5,867,644 A * | 2/1999 | Ranson et al. ................ | 714/39 |
| 5,914,957 A | 6/1999 | Dean et al. | |
| 6,233,074 B1 | 5/2001 | Lahat et al. | |
| 6,240,082 B1 | 5/2001 | Kim et al. | |
| 6,245,587 B1 | 6/2001 | Vallett | |
| 6,256,754 B1 | 7/2001 | Roohparvar | |
| 6,397,354 B1 * | 5/2002 | Ertekin ........................ | 714/34 |
| 6,472,893 B2 | 10/2002 | Martin et al. | |
| 6,697,980 B1 * | 2/2004 | Glasser ....................... | 714/724 |
| 6,782,336 B2 * | 8/2004 | Shah .......................... | 702/118 |

(Continued)

FOREIGN PATENT DOCUMENTS

EP 1 326 172 A2 12/2002

(Continued)

OTHER PUBLICATIONS

Mehrdad Nourani, Detecting Signal-Overshoots for Reliability Analysis in High-Speed System-on-Chips, IEEE Transactions on Reliability, Dec. 2002, pp. 494-504, vol. 51, No. 4.

*Primary Examiner*—Guy Lamarre
*Assistant Examiner*—John P. Trimmings
(74) *Attorney, Agent, or Firm*—Jones Day; Edward L. Pencoske

(57) ABSTRACT

Through addressing circuitry, a sampling circuit can choose a unique internal node/signal on an encapsulated/packaged chip to be output to one or more drivers. The chosen signals available at the target node are directed either through a select circuit to an output pin, or directly to an output pin. In a preferred mode, decode circuits used to select a unique node are serially connected, allowing for a large number of signals to be made available for analyzing without a large impact on circuit layout.

21 Claims, 6 Drawing Sheets

U.S. PATENT DOCUMENTS

| | | |
|---|---|---|
| 6,841,991 B2 | 1/2005 | Martin et al. |
| 7,017,093 B2 * | 3/2006 | Broberg, III ................ 714/724 |
| 7,080,283 B1 * | 7/2006 | Songer et al. ................ 714/30 |
| 7,114,135 B1 * | 9/2006 | Gauvin .......................... 716/4 |
| 2004/0093535 A1 | 5/2004 | Eleyan et al. |
| 2006/0036919 A1 * | 2/2006 | Creigh ....................... 714/724 |

FOREIGN PATENT DOCUMENTS

| | | |
|---|---|---|
| WO | WO 99/17125 | 4/1999 |

* cited by examiner

US 7,251,762 B2

ON-CHIP SAMPLING CIRCUIT AND METHOD

BACKGROUND OF THE INVENTION

The present invention is directed generally to circuit testing and, more particularly, to the testing of circuits constructed using solid state fabrication techniques.

After the fabrication of a chip containing one or more solid state circuits, it is common in the industry to require that the chip pass certain tests before being identified as a good part. For example, after the fabrication of a memory device, the memory device is connected to a tester which automatically performs a series of preprogrammed tests on the part. See, for example, U.S. Pat. No. 6,483,333 entitled Automated Multi-Chip Module Handler and Testing System.

Often during the fabrication of parts, particularly new parts, the signals available at the output pins of the part are insufficient to provide the designer with the information necessary to understand how the part is performing. In those situations, diagnostic systems are available such as the system disclosed in U.S. Pat. No. 6,841,991. In such diagnostic systems, probes are brought into contact with various nodes on the circuit to sample and analyze the signals available at those nodes. For that to be performed, the nodes of the circuit must be available to the probe of the diagnostic system. Thus, the part must be tested before fabrication is complete at which time the circuits of the part are accessible only through the part's output pins.

There is a need to be able to access various nodes within a circuit even after a device has been completely fabricated.

BRIEF SUMMARY

According to one embodiment of the present disclosure, a sampling circuit is comprised of a plurality of probe circuits, with each probe circuit connected to a unique node within an encapsulated and/or packaged circuit to be tested. A decode circuit selects one of the probe circuits to enable the signal available at the unique node to which the probe circuit is connected to be transmitted.

According to another embodiment of the present disclosure, a sampling circuit is comprised of a first plurality of probe circuits, with each probe circuit connected to a unique node within an encapsulated and/or packaged circuit to be tested. A first decode circuit selects one of the first plurality of probe circuits. A second plurality of probe circuits is provided with each of the probe circuits connected to a unique node within the circuit to be tested. A second decode circuit selects one of the second plurality of probe circuits. An output select circuit is provided for selecting between the first plurality of probe circuits and the second plurality of probe circuits so that a unique signal may be output for review and analysis.

Multiple pluralities of probe circuits and decode circuits may be provided. The manner of signal output may vary depending on the number of pins available. For example, if one pin is available, the multiple pluralities of probe circuits will compete with one another via the output select circuit. If two pins are available, one pin may be responsive to one plurality of probe circuits while the other pin is responsive to the other pluralities of probe circuits via a select circuit. Numerous output combinations and permutations are possible.

When the probe circuit of the present disclosure is implemented in the context of a solid state memory device, the various decode circuits and output select circuit(s) may be responsive to address signals or some portion of an address signal. A method of operating such a sampling circuit as well as systems embodying sampling circuits are also disclosed.

BRIEF DESCRIPTION OF THE DRAWINGS

For the present invention to be easily understood and readily practiced, the present invention will now be described, for purposes of illustration and not limitation, in conjunction with the following figures, wherein.

DETAILED DESCRIPTION OF THE INVENTION

Figure 1:
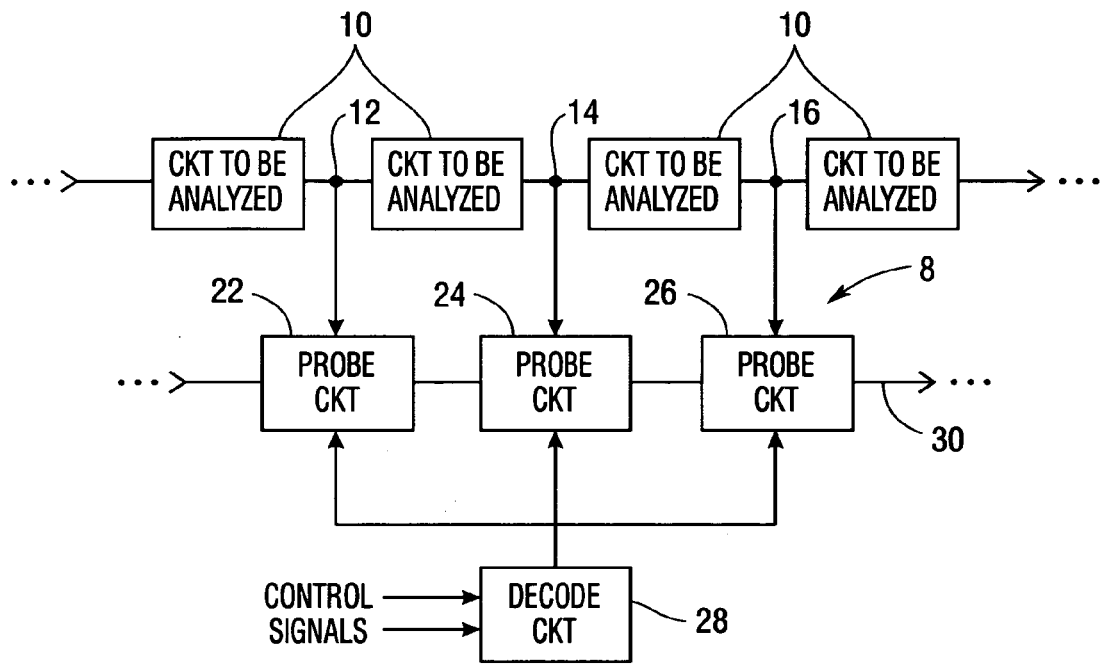
FIG. 1 is a block diagram illustrating a first embodiment of a sampling circuit of the present disclosure.

FIG. 1 is a block diagram illustrating a first embodiment of a sampling circuit 8 constructed according to the teachings of the present disclosure. A circuit 10 to be tested has discrete nodes or tap points 12, 14, 16 identified within the circuit 10. The circuit 10 has been, for example, encapsulated such that the circuit 10 communicates via a plurality of pins (not shown). The nodes 12, 14, 16 are identified as points of interest such that the signals available at those nodes will help engineers, designers, etc. to understand how the circuit 10 is functioning. Each of the nodes 12, 14, 16 is connected to a probe circuit 22, 24, 26, respectively. The probe circuits 22, 24, 26 are serially connected. Each of the probe circuits 22, 24, 26 is responsive to a decode circuit 28 which is responsive to control signals.

In operation, signals available at nodes 12, 14, 16 are received by their respective probe circuits 22, 24, 26. The decode circuit 28, in response to the control signals, selects one of the probe circuits 22, 24, 26 such that the signal available at the selected probe circuit's node is transmitted as shown by the arrow 30. The transmitted signal may be transmitted to more probe circuits (not shown) or connected to an output pin (not shown). In this example, the signals available at nodes 12, 14, 16 are all capable of being analyzed externally of the circuit 10, although only one at a time. In the embodiment illustrated in FIG. 1, the probe circuits 22, 24, 26 together with the decode circuit 28 comprise the sampling circuit 8.

Figure 2:
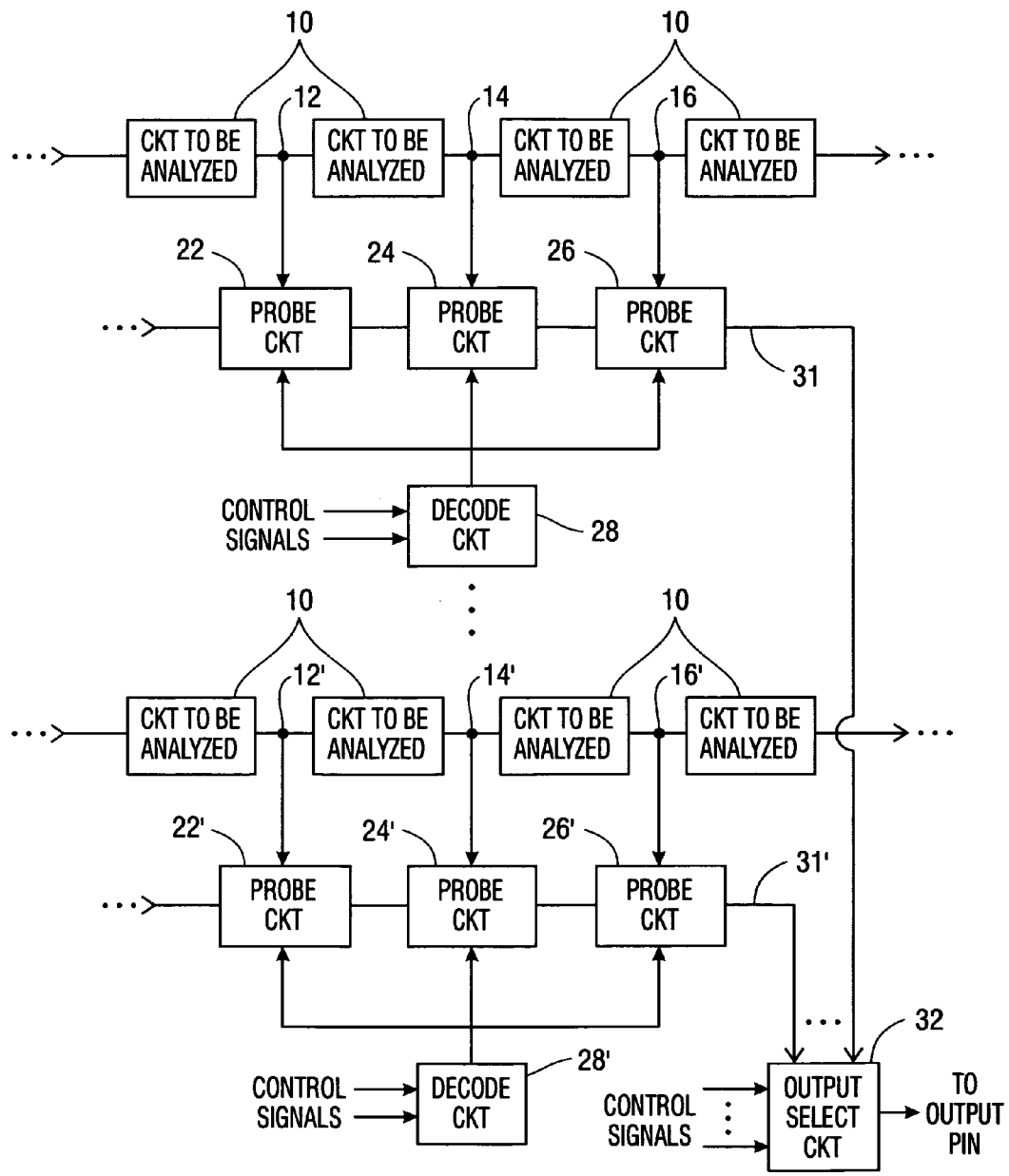
FIG. 2 is a block diagram illustrating another embodiment of a sampling circuit of the present disclosure.

FIG. 2 is a block diagram illustrating another embodiment of a sampling circuit of the present disclosure. The upper half of FIG. 2 is identical to FIG. 1. However, in FIG. 2 additional nodes or tap points 12', 14', 16' have been identified within circuit 10 to be analyzed. The nodes 12', 14', 16' are connected to probe circuits 22', 24', 26', respectively. In addition, an output 31 of probe circuit 26 is connected to an output select circuit 32 while an output 31' of probe circuit 26' is also connected to output select circuit 32.

In operation, control signals are input to the decode circuit 28 to select one of the signals available at nodes 12, 14, 16 to be output at output terminal 31. Similarly, control signals input to decode circuit 28', which may be the same or different from the control signals input to decode circuit 28, select one of the signals available at nodes 12', 14', 16' to be output at output terminal 31'. A plurality of such strings of probe circuits, with each string of probe circuits responsive to various nodes or tap points, may be provided. The output of each of those strings of probe circuits is input to output select circuit 32. Output select circuit 32, in response to control signals input thereto, selects one of the various signals input thereto to be output, preferably to an output pin of the circuit 10 to be tested. Those of ordinary skill in the art will recognize that the number of serially connected probe circuits is limited by the capabilities of the decode circuit. That is, the decode circuit must be able to select one of the probe circuits so that the signal connected thereto is selected for transmission. Similarly, the number of serially connected strings of probe circuits is limited by the ability of the output select circuit 32 to uniquely identify each of the signals input thereto so that any one of the input signals can be selected as the output signal.

The location of the probe circuits, location of the decode circuits, and location of the output select circuit, if needed, is dependent upon available space within circuit 10 to be tested. It is anticipated that early in part life, i.e. when a part is first designed and first fabricated, the number and position of the probe circuits will depend upon various factors such as a need to know how a certain portion of the circuit 10 is operating, what manufacturing defects are being encountered in various hard to manufacture components or portions of the circuit 10, etc. As the circuit 10 proceeds through its normal life, and various problems are solved, subsequent generations of circuit 10 may be designed with fewer probe circuits with the space used to provide other features or functions for the circuit 10. It is anticipated that the present invention will be most useful in the context of circuits 10 which are fabricated using solid state fabrication techniques. When that is the case, it is anticipated that the various probe circuits, decode circuits, and output select circuit (if needed) will be fabricated along with the fabrication of circuit 10.

Figure 3:
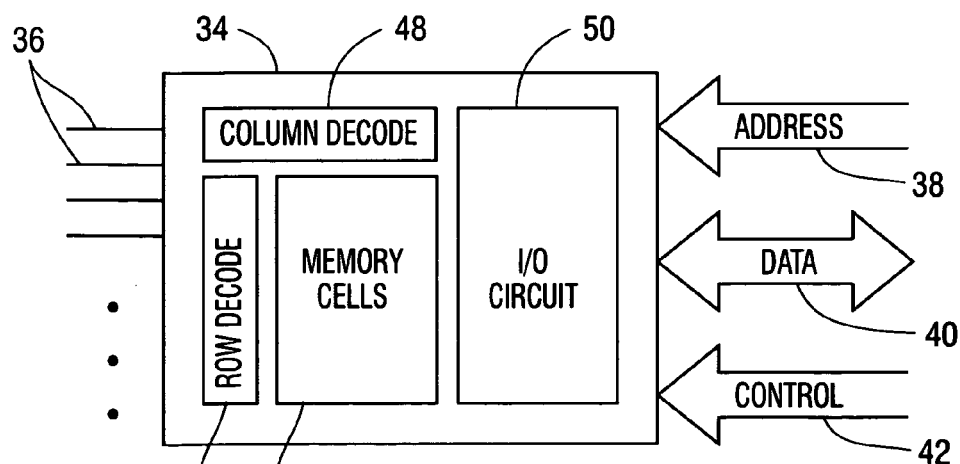
FIG. 3 illustrates one example of a memory device in which the sampling circuit of the present disclosure may be implemented.

It is anticipated that the sampling circuit 8 of the present invention may be implemented in a wide variety of devices. One type of device, a memory device 34, is illustrated in FIG. 3. The memory device 34 may be part of a dual in-line memory module (DIMM) or a printed circuit board (PCB) containing many such memory devices 34. The memory device 34 may include a plurality of pins 36 located outside of memory device 34 for electrically connecting the memory device 34 to other devices. Some of those pins 36 may constitute memory address pins or an address bus 38, data (DQ) pins or a data bus 40, and control pins or a control bus 42. It is evident that each of the reference numerals 38, 40, 42 designates more than one pin in the corresponding bus. Further, it is understood that the block diagram in FIG. 3 is for illustration purposes only. That is, the pin arrangement or configuration in other types of memory devices 34 may not be as shown in FIG. 3. For example, in some types of memory devices 34 there is a single bus which is time multiplexed. At certain points of time, the common bus carries address information, at other points data information, and at other times control information. Thus, references to, for example, an address bus refers to both a dedicated address bus as well as a time multiplexed bus.

Continuing with the description of FIG. 3, a processor or memory controller (not shown in FIG. 3) may communicate with device 34 to perform memory read/write operations. The processor and the memory device 34 may communicate using address signals on address lines or address bus 38, data signals on data lines or data bus 40, and control signals (e.g. row address select (RAS) signal, column address select (CAS) signal, chip select (CS) signal etc. (not shown)) on control lines or control bus 42. The width, i.e. number of pins, of the address, data and control buses may differ from one memory configuration to another.

The device 34 may include a plurality of memory cells 44 generally arranged in an array of rows and columns. A row decode circuit 46 and a column decode circuit 48 may select the rows and columns, respectively, in the array 44 in response to decoding an address provided on the address bus 38. Data to/from the array of memory cells 44 are then transferred to the data bus 40 via sense amplifiers and a data output path, shown generally as input/output (I/O) circuit 50. A memory controller (not shown) may provide relevant control signals (not shown) on the control bus 42 to control data communication to/from the memory device 34 via the input output circuit 50. The I/O circuit 50 may include the aforementioned sense amplifiers and data output path including a number of data output buffers or output drivers to receive the data bits from the memory cells comprising the array of cells 44 and provide those data bits or data signals to the corresponding data lines in the data bus 40. The I/O circuit 50 may also include various memory input buffers and control circuits that interact with the row and column decoders 46, 48, respectively, to select the memory cells for data read/write operations.

The memory controller (not shown) may determine the modes of operation of memory device 34. Some examples of the input signals or control signals not shown in FIG. 1, but which may be available on control bus 42 include an external clock (CLK) signal, a chip select (CS) signal, a row address strobe (RAS) signal, a column address strobe (CAS) signal, a write enable (WE) signal, etc. The encapsulated/packaged memory device 34 communicates with other devices connected thereto via the pins 36. One or more of the pins 36, not being used for address, data, or control signals, may be used as the output pin for the sampling circuit. More than one output pin may be provided assuming unused pins are present.

In addition to the pads previously described (address, data, etc.), extra pads may be added for the express purpose of providing outputs for various embodiments. Such extra pads would likely not be made available to the customer. That is, such extra pads would not be routed to external pins on packages destined for the consumer. However, such extra pads may or may not be routed to pins on packages created for the sole purpose of engineering analysis, such as special test packages. In cases where these pads are not routed to package pins, all analysis would be performed at the wafer or pre-packaged die level. Thus, data from circuits of the present disclosure may be output in at least four ways: (1) from pads already existing for normal chip operation (address pins, data pins, etc.); (2) from package pins/balls existing for normal chip operation; (3) from pads created for the specific purpose of providing specific outputs (available or unavailable to the customer); and (4) from package pins/balls created for the specific purpose of providing outputs. These pins/balls would be connected to pads from number 3 above, and would likely be unavailable to the customer.

Those of ordinary skill in the art will recognize that the memory device 34 of FIG. 3 is simplified to illustrate one embodiment of a memory device and is not intended to be a detailed illustration of all of the features of a typical memory device. Numerous peripheral devices or circuits are typically provided for writing data to and reading data from the array of memory cells 44. However, those peripheral devices are not shown in FIG. 3 for the sake of clarity.

Figure 4A:
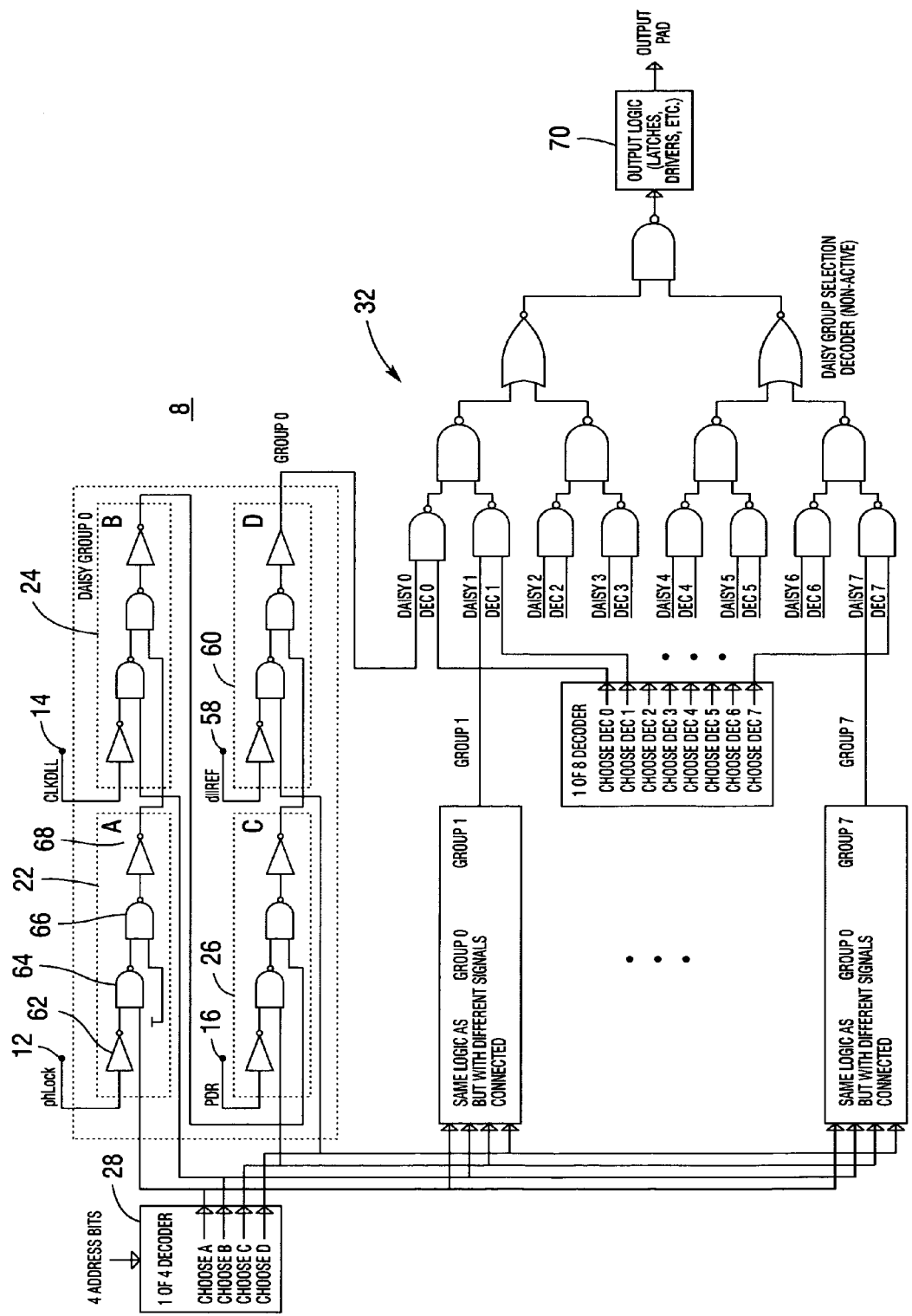
FIGS. 4A and 4B illustrate various exemplary circuitry for implementing the block diagram of FIG. 2.

FIG. 4A illustrates various exemplary circuitry for implementing the block diagram of FIG. 2. In FIG. 4A, nodes 12, 14, 16 receive the signals phLock, CLK DLL, and PDR, respectively. A fourth node 58 receives the signal d11 REF. The probe circuits 22, 24, 26 are illustrated along with a fourth probe circuit 60. Each of the probe circuits is comprised in this exemplary embodiment of an inverter 62 receiving the signal from that probe circuit's node. A first logic gate 64 is responsive to the inverter 62 and a signal from the decode circuit 28. Decode circuit 38 may be responsive to a portion of an address signal. A second logic gate 66 is responsive to the first logic gate 64 and the previous probe signal or, in the case of the first probe circuit in a series of probe circuits, a predetermined voltage source, e.g. Vdd (high). An inverter 68, responsive to the second logic gate 66, provides the output of the probe circuit. Each of the probe circuits 24, 26, 60 is similar in construction and operation to the probe circuit 22. The series connected probe circuits 22, 24, 26, 60 is referred to in FIG. 4A as the group 0 probe circuits. As shown in FIG. 4A, there are seven (7) other groups of probe circuits, each with the same logic as group 0 but with different signals connected thereto. The decode circuit 28 enables selection of any one of the probe circuits 22, 24, 26, 60 within each of the groups 0-7. Each of the groups of serially connected probe circuits is connected to the output select circuit 32. The output select circuit 32 is, as shown in FIG. 4A, a group of logic gates responsive to control signals to enable one of the signals output from one of the groups 0-7 to be selected as the output of the sampling circuit 8. The signal selected for output by the output select circuit 32 is input to output logic 70 which may comprise a normal output path for the device in which the sampling circuit is located. For example, in the context of a memory device 34, output logic 70 may include latches and drivers, or other appropriate circuitry, for driving the output signal on to one of the output pads of the device, which is ultimately connected to the output pin.

Figure 4B:
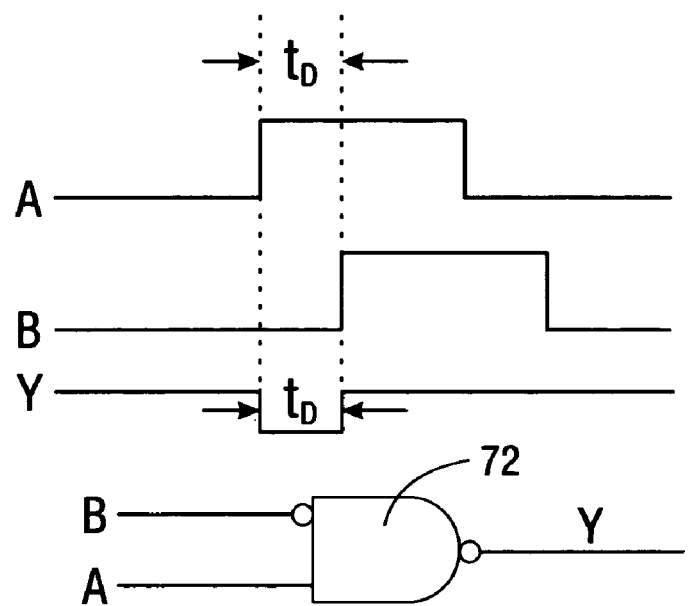

Circuits that mix or compare signals before sending a signal to an output may be included. Mixing and comparing type circuits would have more than one tapped node going into the same circuit, and would provide useful relative timing information. For example, in FIG. 4B, two separate signals are input to a NAND gate 72 that may be used to provide relative timing information as shown by the simple timing diagram for the signals A, B and Y.

Figure 5:
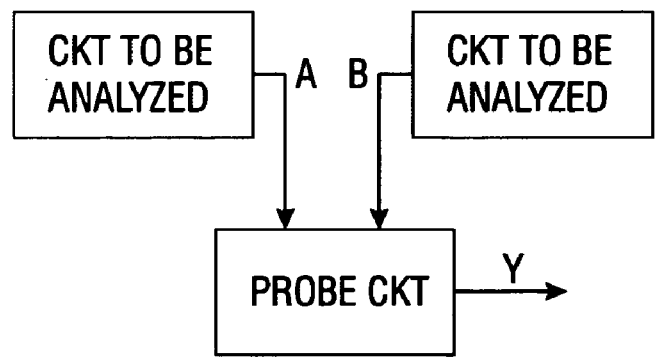
FIG. 5 illustrates another embodiment of the present disclosure.

The figures that have been discussed so far imply that all nodes 12, 14, 16, etc. are related in some way, i.e. nodes 12 and 14 are separated by the "circuit to be analyzed". That need not necessarily be true. Nodes 12, 14, 16, etc. can be from completely separate and disjoint circuits. FIG. 5 illustrates that one node to be analyzed is located in a first circuit and provides the signal A (of FIG. 4B) while another node in another circuit to be analyzed provides the signal B (of FIG. 4B) which are input to the probe circuit which produces the output signal Y. The probe circuit in FIG. 5 could be responsive to a decode circuit as previously discussed.

The embodiment shown in FIG. 4A assumes that only one output pin is available on the device such that the output select circuit 32 is required to enable one signal at a time to be output. However, should two output pins be available, two output select circuits 32 may be provided with each of the output select circuits handling some number of the groups 0-7 so that two signals may be simultaneously output. Alternatively, if one of the groups is determined to be more important than the other groups of serially connected probe circuits, one of the groups, for example group 0, could be connected to an output pin through its own output logic 70, and the remainder of the groups, group 1-7, could be connected to their own output logic 70 through an output select circuit 32. Thus, those of ordinary skill in the art will recognize that many output combinations are possible depending upon the number of pins available for the signals.

Figure 6:
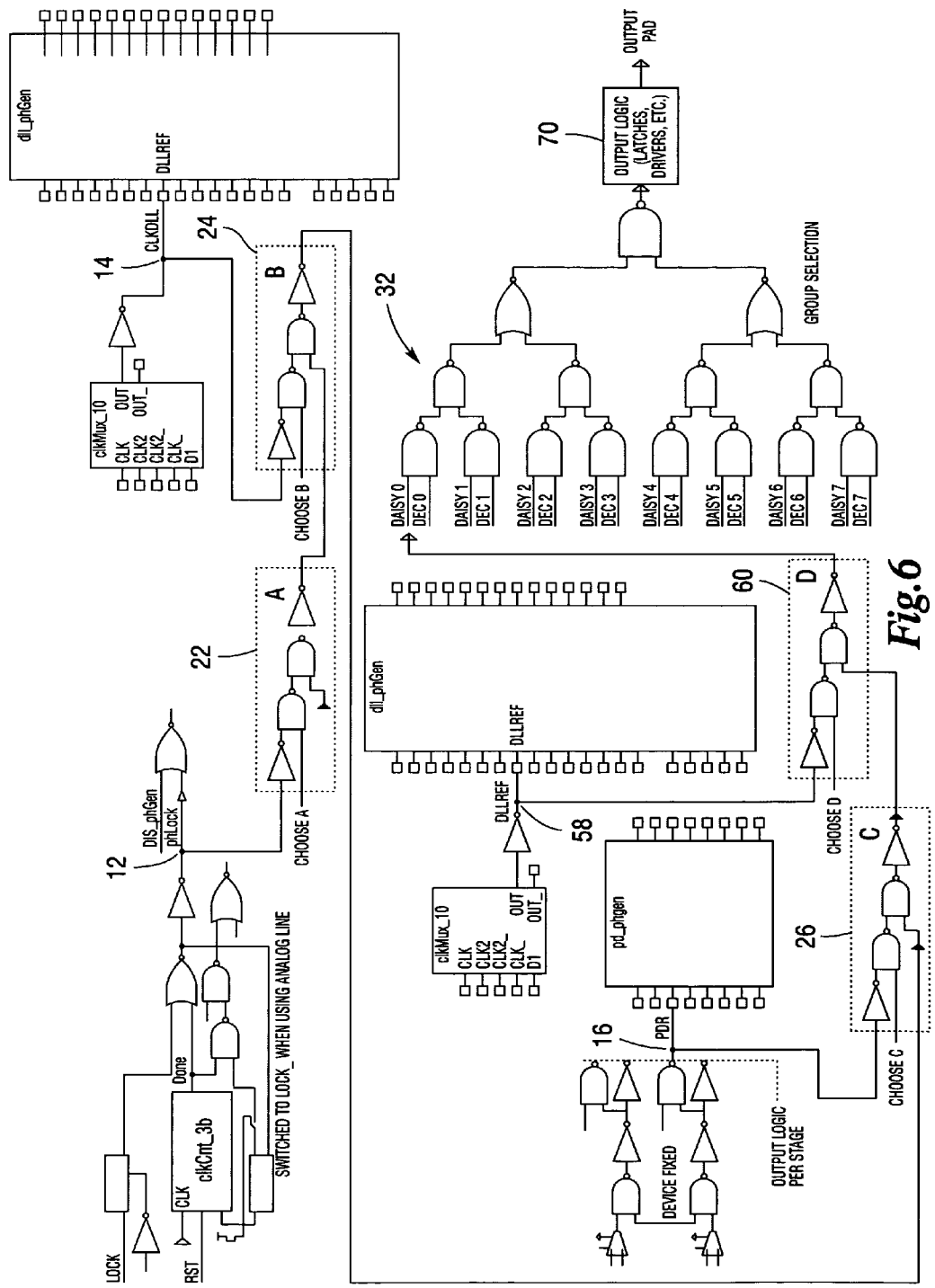
FIG. 6 illustrates circuits, within a device to be tested, connected to the sampling circuit of the present disclosure.

FIG. 6 illustrates various sections, i.e. circuits, within the circuit 10 to be tested connected to the probe circuits 22, 24, 26, 60 of group 0 illustrated in FIG. 4A. FIG. 6 illustrates how the sampling circuit 8 of the present invention may be integrated within a circuit to be tested such as a memory device 34. FIG. 6 illustrates the location of the tap points 12, 14, 16, 58 within the circuit 10 to be tested. The illustrated tap points are provided for purposes of illustration and not limitation. Clearly, the number and location of tap points will depend upon the circuit to be tested and the maturity of the circuit.

Figure 7:
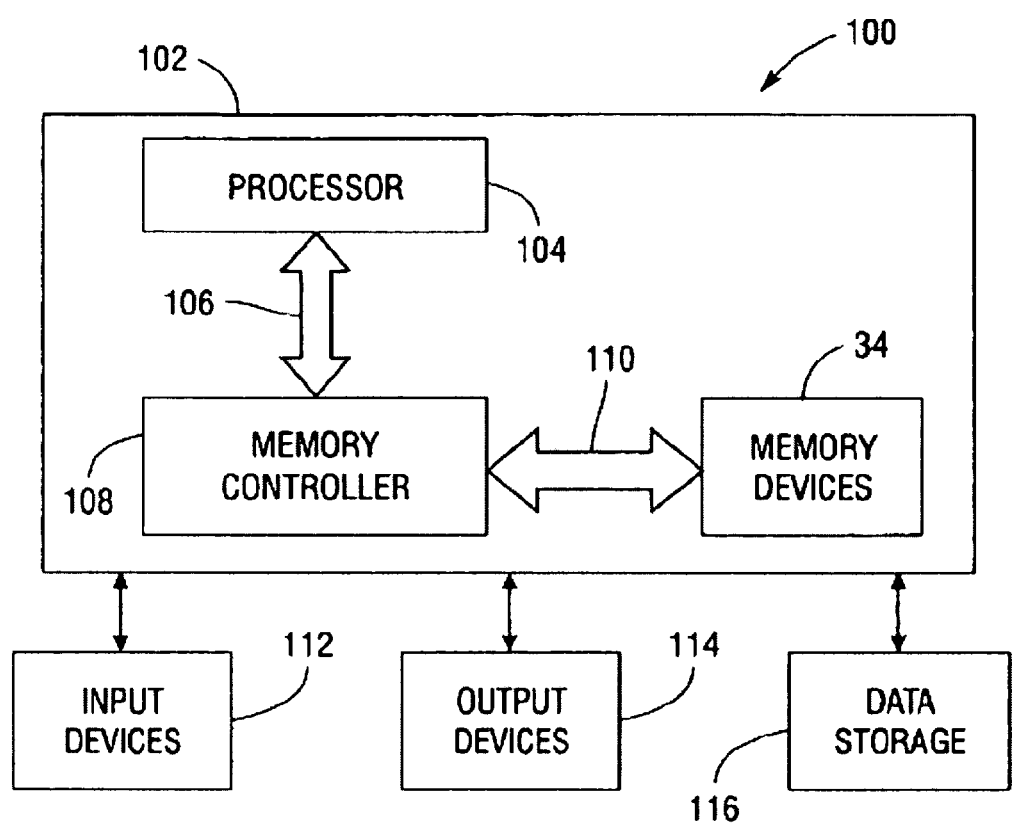
FIG. 7 illustrates a system using one or more devices incorporating the sampling circuit of the present disclosure.

FIG. 7 is a block diagram depicting a system 100 in which one or more memory chips 34 illustrated in FIG. 3 may be used. The system 100 may include a data processing unit or computing unit 102 that includes a processor 104 for performing various computing functions, such as executing specific software to perform specific calculations or data processing tasks. The computing unit 102 also includes a memory controller 108 that is in communication with the processor 104 through a bus 106. The bus 106 may include an address bus (not shown), a data bus (not shown), and a control bus (not shown), or a single, time multiplexed bus. The memory controller 108 is also in communication with a set of memory devices 34 (i.e., multiple memory chips 34 of the type shown in FIG. 3) through another bus 110. Each memory device 34 may include appropriate data storage and retrieval circuitry as shown in FIG. 3. The processor 104 can perform a plurality of functions based on information and data stored in the memories 34.

The memory controller 108 can be a microprocessor, digital signal processor, embedded processor, micro-controller, dedicated memory test chip, a tester platform, or the like. The memory controller 108 may control routine data transfer operations to/from the memories 34, for example, when the memory devices 34 are part of an operational computing system 102. The memory controller 108 may reside on the same motherboard (not shown) as that carrying the memory chips 34. Various other configurations between the memory chips 34 and the memory controller 108 may be possible. For example, the memory controller 108 may be a remote entity communicating with the memory chips 34 via a data transfer or communications network (e.g., a LAN (local area network) of computing devices).

The system 100 may include one or more input devices 112 (e.g., a keyboard or a mouse) connected to the computing unit 102 to allow a user to manually input data, instructions, etc., to operate the computing unit 102. One or more output devices 114 connected to the computing unit 102 may also be provided as part of the system 100 to display or otherwise output data generated by the processor 104. Examples of output devices 114 include printers, video terminals or video display units (VDUs). In one embodiment, the system 100 also includes one or more data storage devices 116 connected to the data processing unit 102 to allow the processor 104 to store data in or retrieve data from internal or external storage media (not shown). Examples of typical data storage devices 116 include drives that accept hard and floppy disks, CD-ROMs (compact disk read-only memories), and tape cassettes.

While the present invention has been described in connection with preferred embodiments thereof, those of ordinary skill in the art will recognize that many modifications and variations are possible. The present invention is intended to be limited only by the following claims and not by the foregoing description which is intended to set forth the presently preferred embodiments.

What is claimed is:

1. A sampling circuit for providing signals from various points within an encapsulated device to be tested, comprising: a plurality of serially connected probe circuits, each probe circuit connected to a node within a circuit to be tested; and a decode circuit for selecting one of said probe circuits to enable a signal available at a node to which said selected probe circuit is connected to be transmitted to an output.

2. The sampling circuit of claim 1 wherein said device to be tested includes a memory device, and wherein said decode circuit is responsive to a portion of an address signal.

3. The sampling circuit of claim 1 wherein said sampling circuit and said device to be tested are fabricated together.

4. A sampling circuit for providing signals from various points within a packaged device to be tested, comprising: a first plurality of serially connected probe circuits, each connected to a node within a circuit to be tested; a first decode circuit for selecting one of said first plurality of probe circuits; a second plurality of serially connected probe circuits, each connected to a node within said circuit to be tested; a second decode circuit for selecting one of said second plurality of probe circuits; and an output select circuit for selecting between said first plurality of probe circuits and said second plurality of probe circuits to enable a signal available at a node to which the selected probe circuit is connected to be transmitted to an output.

5. The sampling circuit of claim 4 wherein said circuit to be tested includes a memory device, and wherein said first and second decode circuits are each responsive to a different portion of an address signal.

6. The sampling circuit of claim 4 wherein said circuit to be tested includes a memory device, and wherein said first and second decode circuits are implemented with a single circuit.

7. The sampling circuit of claim 4 wherein said circuit to be tested includes a memory device, and wherein said output select circuit is responsive to a portion of an address signal.

8. The sampling circuit of claim 4 wherein said sampling circuit and said circuit to be tested are fabricated together.

9. A sampling circuit for providing signals from various points within a packaged circuit to be tested, comprising: a first plurality of serially connected probe circuits, each connected to a node within a circuit to be tested; a first decode circuit for selecting one of said first plurality of probe circuits to enable a signal available at a node to which the selected probe circuit is connected to be transmitted to a first output; a second plurality of serially connected probe circuits, each connected to a node within said circuit to be tested; a second decode circuit for selecting one of said second plurality of probe circuits; a third plurality of serially connected probe circuits, each connected to a node within said circuit to be tested; a third decode circuit for selecting one of said third plurality of probe circuits; and an output select circuit for selecting between said second plurality of probe circuits and said third plurality of probe circuits to enable a signal available at a node to which the selected probe circuit is connected to be transmitted to a second output.

10. The sampling circuit of claim 9 wherein said circuit to be tested includes a memory device, and wherein said first, second and third decode circuits are each responsive to a different portion of an address signal.

11. The sampling circuit of claim 9 wherein said circuit to be tested includes a memory device, and wherein said first, second and third decode circuits are implemented with a single circuit.

12. The sampling circuit of claim 9 wherein said circuit to be tested includes a memory device, and wherein said output select circuit is responsive to a portion of an address signal.

13. The sampling circuit of claim 9 wherein said sampling circuit and said circuit to be tested are fabricated together.

14. A sampling circuit for providing signals from various points within a packaged circuit to be tested, comprising: a first plurality of serially connected probe circuits, each connected to a node within a circuit to be tested; a first decode circuit for selecting one of said first plurality of probe circuits; a second plurality of serially connected probe circuits, each connected to a node within said circuit to be tested; a first output select circuit for selecting between said first plurality of probe circuits and said second plurality of probe circuits to enable a signal available at a node to which the selected probe circuit is connected to be transmitted to a first output; a third plurality of serially connected probe circuits, each connected to a node within said circuit to be tested; a third decode circuit for selecting one of said third plurality of probe circuits; a fourth plurality of serially connected probe circuits, each connected to a node within said circuit to be tested; a fourth decode circuit for selecting one of said fourth plurality of probe circuits; and a second output select circuit for selecting between said third plurality of probe circuits and said fourth plurality of probe circuits to enable a signal available at a node to which the selected probe circuit is connected to be transmitted to a second output.

15. The sampling circuit of claim 14 wherein said circuit to be tested includes a memory device, and wherein said first, second, third and fourth decode circuits are each responsive to a different portion of an address signal.

16. The sampling circuit of claim 14 wherein said circuit to be tested includes a memory device, and wherein said first, second, third and fourth decode circuits are implemented with a single circuit.

17. The sampling circuit of claim 14 wherein said circuit to be tested includes a memory device, and wherein said first and second output select circuits are each responsive to a different portion of an address signal.

18. The sampling circuit of claim 14 wherein said circuit to be tested includes a memory device, and wherein said first and second output select circuits are implemented with a single circuit.

19. The sampling circuit of claim 14 wherein said sampling circuit and said circuit to be tested are fabricated together.

20. A method of operating a sampling circuit for providing signals from various points within an encapsulated circuit to be tested, comprising: providing a plurality of signals from nodes within a circuit to be tested to a plurality of serially connected probe circuits; and selecting one of said probe circuits to enable a signal available at a node to which said selected probe circuit is connected to be transmitted to an output.

21. The method of claim 20 wherein said circuit to be tested includes a memory device, and wherein said selecting is in response to a portion of an address signal.

* * * * *